US012812806B2

(12) United States Patent
Park et al.

(10) Patent No.: US 12,812,806 B2
(45) Date of Patent: Nov. 24, 2026

(54) DISPLAY DEVICE, AND ELECTRONIC DEVICE INCLUDING THE SAME

(71) Applicant: Samsung Display Co., LTD., Yongin-si (KR)

(72) Inventors: Youngjin Park, Yongin-si (KR); Jooyoung Kim, Yongin-si (KR); Young-Joo Nam, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 94 days.

(21) Appl. No.: 19/062,364

(22) Filed: Feb. 25, 2025

(65) Prior Publication Data

US 2025/0386446 A1 Dec. 18, 2025

(30) Foreign Application Priority Data

Jun. 17, 2024 (KR) ........................ 10-2024-0078147

(51) Int. Cl.
*H05K 5/03* (2006.01)

(52) U.S. Cl.
CPC ...................................... *H05K 5/03* (2013.01)

(58) Field of Classification Search
None
See application file for complete search history.

(56) References Cited

U.S. PATENT DOCUMENTS 9,515,092 B2 * 12/2016 Hwang ................. G02F 1/1345
10,211,415 B2 * 2/2019 Kang ........................ G06F 1/16
11,425,818 B2 * 8/2022 Wu ..................... G02F 1/13452
2002/0075439 A1 * 6/2002 Uehara ................. G02F 1/1345 349/149
2008/0062360 A1 * 3/2008 Kobayashi ............ G02F 1/1339 349/123
2012/0325536 A1 * 12/2012 Negoro ............... G02F 1/13454 156/295
2014/0307396 A1 * 10/2014 Lee ................... G02F 1/133305 29/830
2017/0148374 A1 * 5/2017 Lee ..................... G02F 1/13336
2017/0374740 A1 * 12/2017 Yamaguchi ......... G02F 1/13306

FOREIGN PATENT DOCUMENTS

KR 101174834 B1 8/2012
KR 1020150033461 A 4/2015
KR 1020160093775 A 8/2016
KR 1020200067270 A 6/2020
KR 1020220063842 A 5/2022

* cited by examiner

*Primary Examiner* — Xanthia C Relford
(74) *Attorney, Agent, or Firm* — CANTOR COLBURN LLP

(57) ABSTRACT

A display device includes a display panel, a base film, which is attached to the display panel and protects the display panel, a cover panel attached to the base film by an adhesive layer on a side of the base film opposite to a side of the base film to which the display panel is attached, and a printed circuit board (PCB) attached to the cover panel by PCB adhesive therebetween and electrically connected to the display panel via a flexible printed circuit board (FPCB), where a cut line region is formed around an area where the PCB is attached on the cover panel to have an area larger than the area of the PCB in a plan view.

15 Claims, 10 Drawing Sheets

DISPLAY DEVICE, AND ELECTRONIC DEVICE INCLUDING THE SAME

This application claims priority to Korean Patent Application No. 10-2024-0078147, filed on Jun. 17, 2024, and all the benefits accruing therefrom under 35 U.S.C. § 119, the content of which in its entirety is herein incorporated by reference.

BACKGROUND

1. Field

The present disclosure relates to a display device, and more specifically, to the display device in which a PCB is attached to a cover panel.

2. Description of the Related Art

Currently known display devices include liquid crystal displays ("LCD"), plasma display panels PDP, organic light emitting diode devices ("OLED"), field emission displays ("FED"), electrophoretic display devices, etc.

Such display devices may include a display area that implements an image and receives electricity from an external power source to display on the display area, and a pad area that transmits input signals entered from the display area to a control unit.

The display area includes gate lines and data lines crossing each other, thin-film transistors ("TFT") connected to the lines, and an image implementation layer connected to the thin-film transistors. Additionally, the pad area includes a structure in which gate electrodes and data electrodes extending from the gate lines and data lines are stacked, and a flexible printed circuit board may be connected to exchange electrical signals from an external power source and a driving circuit.

During the manufacturing of such display devices, when product performance inspection is performed after the flexible printed circuit board is connected, there may occasionally be products with problems. To do this, a rework process may be performed to remove the connected flexible printed circuit board, solve the problem, and then reconnect the flexible printed circuit board.

SUMMARY

According to the present disclosure, an object is to provide a display device structure that may be easily separated from a cover panel without damaging the cover panel when separating a PCB for a rework process.

A display device according to an embodiment of the present disclosure includes a display panel, a base film, which is attached to the display panel and protects the display panel, a cover panel attached to the base film by an adhesive layer on a side of the base film opposite to a side of the base film to which the display panel is attached, and a printed circuit board ("PCB") attached to the cover panel by PCB adhesive therebetween and electrically connected to the display panel via a flexible printed circuit board, where a cut line region is formed around an area where the PCB is attached on the cover panel to have an area larger than the area of the PCB in a plan view.

The cover panel may be formed of aluminum (Al) film.

A boundary line of the cut line region may be formed as a partially cut dotted line.

The boundary line of the cut line region may extend along an edge of the PCB in a plane of the PCB.

The cut line region may be formed to penetrate the cover panel in a direction in which the cover panel is attached to the base film.

The cut line region may be formed as an area that is 4.5 millimeters (mm) to 5.5 mm larger than the area where the PCB is attached to the cover panel in a plan view.

An opening may be defined in the adhesive layer in a region corresponding to the cut line region.

The opening in the adhesive layer may have a size corresponding to the cut line region.

The adhesive layer may be formed with that adhesiveness is removed in a region corresponding to the cut line region.

An area of the adhesive layer where adhesiveness is removed may have a size corresponding to the cut line region.

The PCB adhesive may be removed after the PCB is detached from the cover panel.

The cut line region may include at least one rework handle that protrudes outward from a boundary line of the cut line region and is provided to detach the PCB from the cover panel.

The rework handle may be formed at a corner of the cut line region.

The rework handle may be formed of the same material as the cover panel.

An electronic device according to an embodiment of the present disclosure includes a display device; and a power supply configured to provide power to the display device. The display device includes a display panel, a base film, which is attached to the display panel and protects the display panel, a cover panel attached to the base film by an adhesive layer on a side of the base film opposite to a side of the base film to which the display panel is attached, and a printed circuit board ("PCB") attached to the cover panel by PCB adhesive therebetween and electrically connected to the display panel via a flexible printed circuit board, where a cut line region is formed around an area where the PCB is attached on the cover panel to have an area larger than the area of the PCB in a plan view.

According to an embodiment of the present disclosure, the PCB may be easily detached from the cover panel during the rework process of the display device.

Additionally, damage to the cover panel may be prevented when removing the PCB.

Additionally, the workability of the rework process may be improved and the process time may be shortened.

Additionally, the risk of operator injury during rework may be minimized.

DETAILED DESCRIPTION

Figure 1:
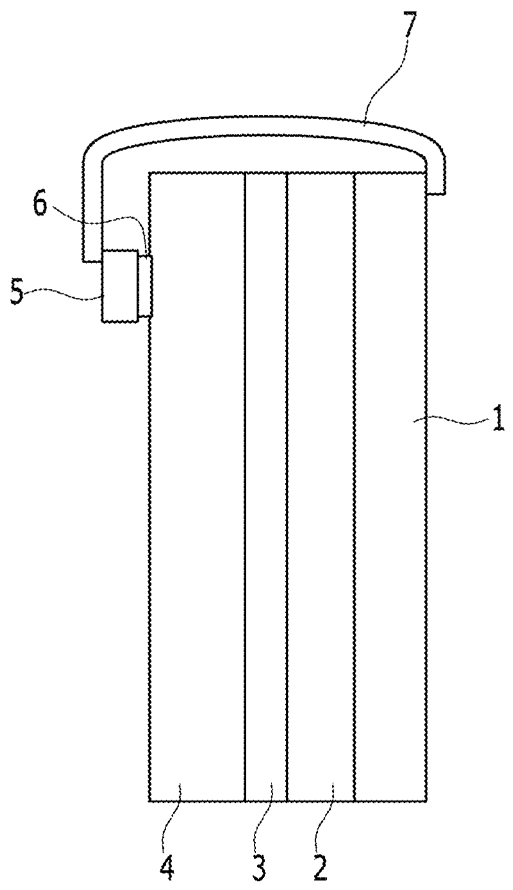
FIG. 1 Prior Art
FIG. 1 is a cross-sectional view of a conventional display device.

Hereinafter, with reference to the attached drawings, embodiments of the present disclosure will be described in detail so that those skilled in the art may easily implement the present disclosure. The invention may be implemented in many different forms and is not limited to the embodiments described herein.

In order to clearly explain the present disclosure, parts that are not relevant to the description are omitted, and identical or similar components are assigned the same reference numerals throughout the specification.

In addition, the size and thickness of each component shown in the drawings are arbitrarily shown for convenience of explanation, so the present disclosure is not necessarily limited to that which is shown. In the drawings, the thickness is enlarged to clearly express various layers and areas. And in the drawings, for convenience of explanation, the thickness of some layers and regions are exaggerated.

Additionally, when a part of a layer, membrane, region, or plate is said to be "above" or "on" another part, this includes not only cases where it is "directly above" another part, but also cases where there is another part in between. In contrast, when an element is referred to as being "directly on" another element, there are no intervening elements present. In addition, being "above" or "on" a reference part means being located above or below the reference part, and does not necessarily mean being located "above" or "on" it in the direction opposite to gravity.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In addition, throughout the specification, when a part is said to "include" a certain component, this means that it may further include other components rather than excluding other components, unless specifically stated to the contrary.

Figure 2:
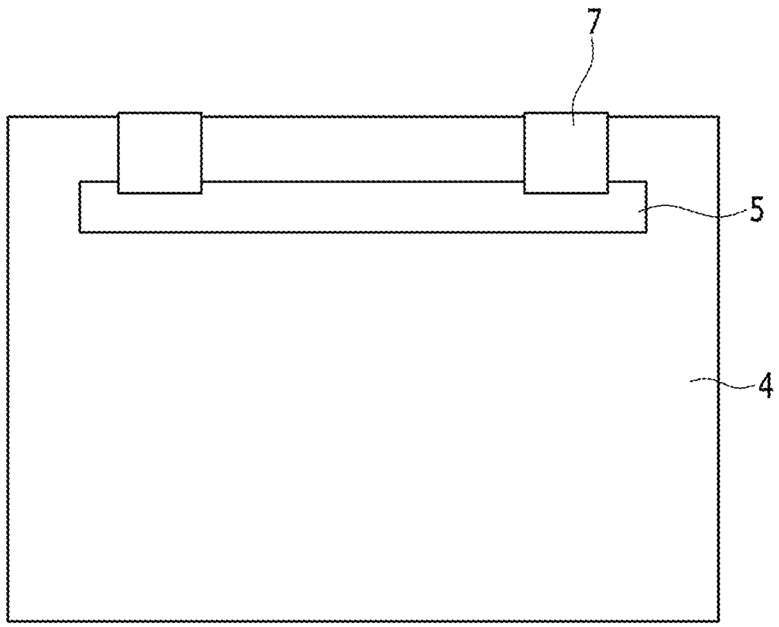
FIG. 2 Prior Art
FIG. 2 is a top view of a conventional display device.

FIG. 1 is a cross-sectional view of a conventional display device, and FIG. 2 is a top view of a conventional display device.

As shown in FIGS. 1 and 2, a printed circuit board 5 may be attached to a cover panel 4 by an adhesive 6, while a base film 2 and the cover panel 4 may be bonded together using an adhesive 3. A display panel 1 laminated on the base film 2 may be connected to the printed circuit board 5 by a flexible printed circuit board ("FPCB") 7.

Figure 3:
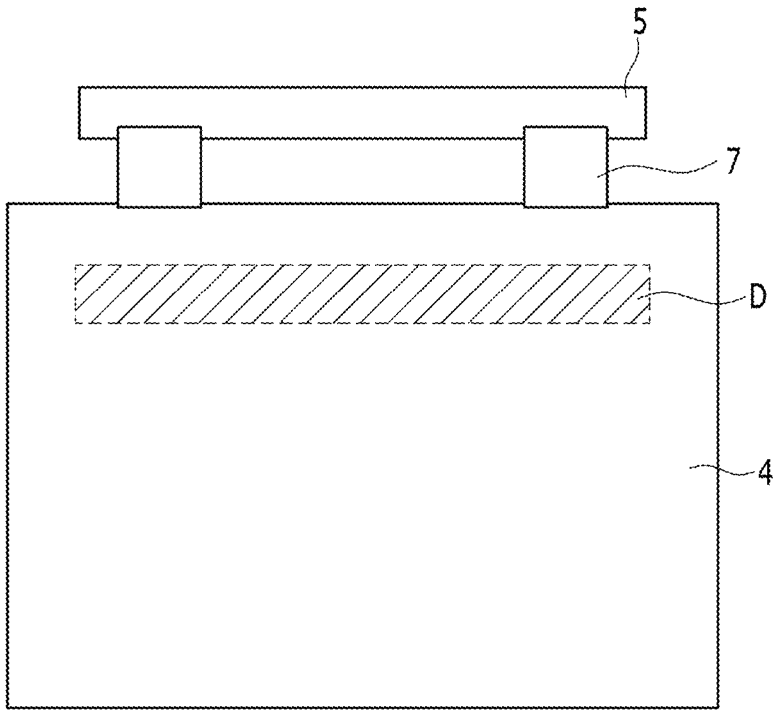
FIG. 3 Prior Art
FIG. 3 is a plan view showing a state in which the PCB is detached during a rework process in a conventional display device.

In order to perform a rework process, the printed circuit board 5 that is already connected may be removed. As shown in FIG. 3, when separating the printed circuit board 5 from the cover panel 4, the separation is not easy due to the strong adhesiveness of the adhesive 6, and there is a high possibility that the cover panel 4 at an area D where the printed circuit board 5 was attached will be damaged. Additionally, the laminated structure of the pad area or the substrate may be damaged while removing the printed circuit board. This impedes the workability of the rework process and causes a problem in which the process time (tact time) is delayed.

Hereinafter, a display device according to an embodiment of the present disclosure will be described with reference to FIGS. 4 to 7.

Figure 4:
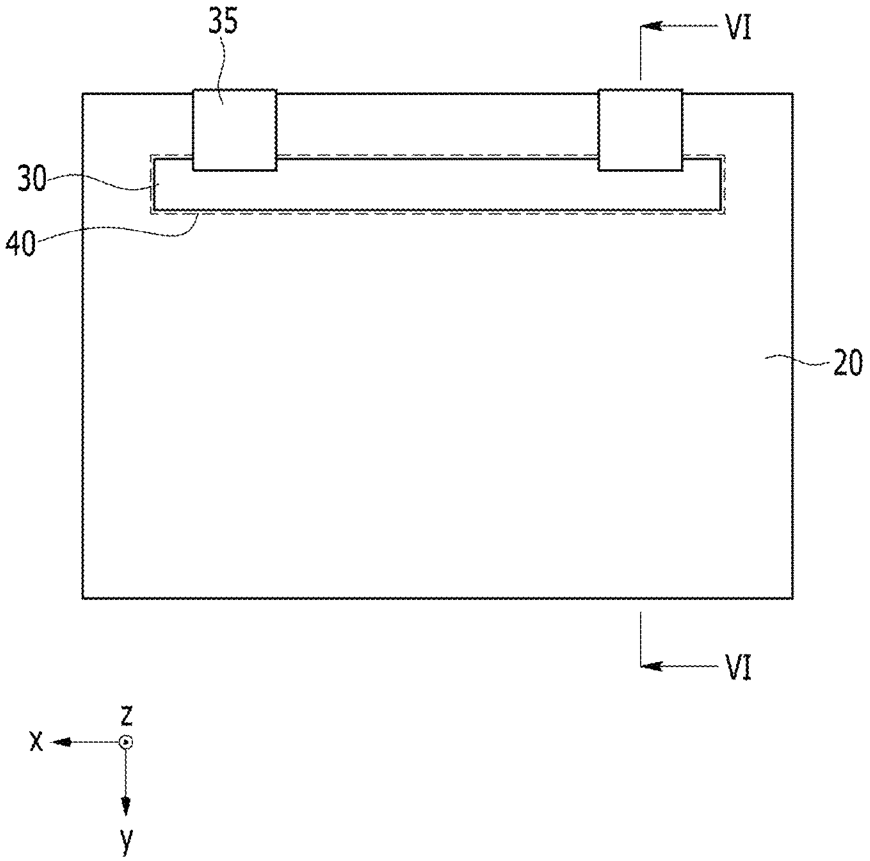
FIG. 4 is a plan view of a display device according to an embodiment of the present disclosure.
Figure 5:
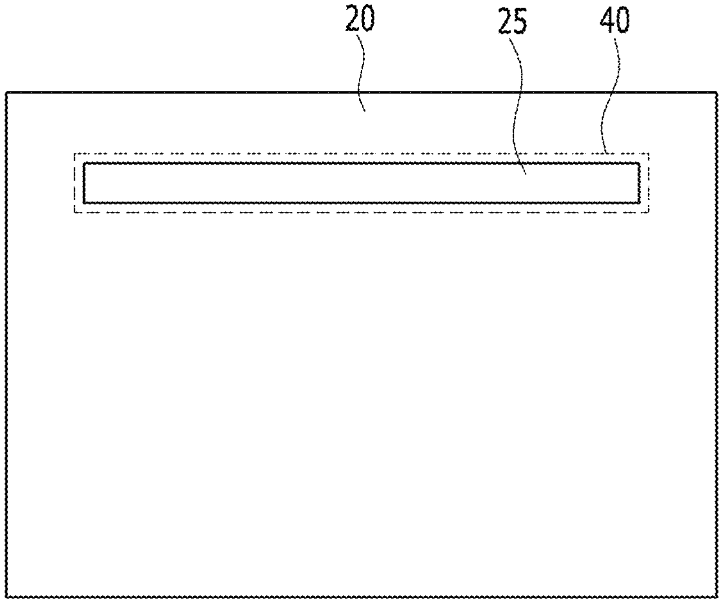
FIG. 5 is a plan view showing a state in which the PCB and FPCB are not attached in the display device according to an embodiment of the present disclosure.
Figure 6:
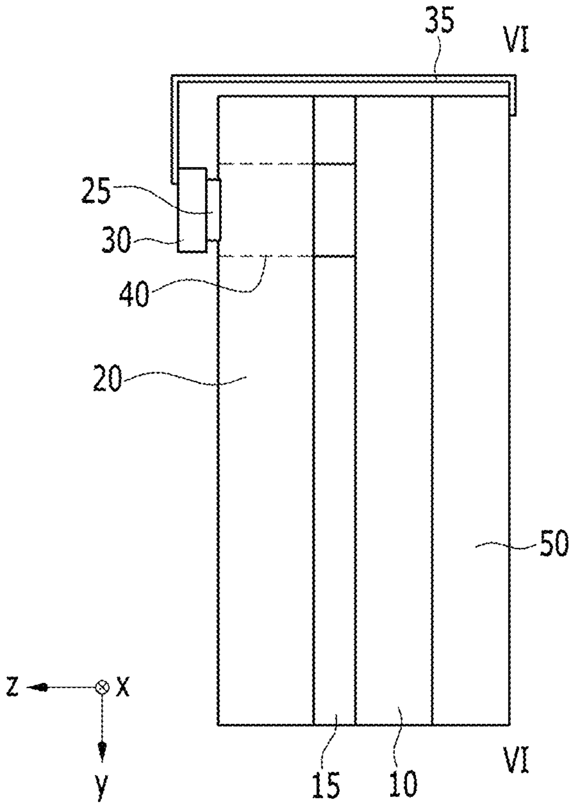
FIG. 6 is a cross-sectional view taken along line VI-VI of FIG. 4.

FIG. 4 is a plan view of a display device according to an embodiment of the present disclosure, FIG. 5 is a plan view showing a state in which the PCB and FPCB are not attached in the display device according to an embodiment of the present disclosure, and FIG. 6 is a cross-sectional view taken along line VI-VI of FIG. 4. As used herein, the plan view is a view in a thickness direction (z direction) of the display device (especially, display panel 50).

Referring to FIG. 4 to FIG. 6, a display device according to an embodiment of the present disclosure includes a base film 10, a cover panel 20, a display panel 50, and a printed circuit board (PCB) 30.

A display panel 50 is attached to one side of the base film 10, and a cover panel 20 is attached to the opposite side of the base film 10. The base film 10 may serve to stably support the display panel 50 attached thereon and protect it from impacts, etc. Additionally, the base film 10 may prevent damage to the display device by providing a certain strength and flatness to the display device.

The base film 10 may be made of or including polyester (polyethylene terephthalate, "PET") or polyethylene naphthalate ("PEN").

The cover panel 20 is attached to the base film 10 by an adhesive layer 15 on the opposite side of the base film 10 opposite to the one side of the base film to which the display panel 50 is attached. The cover panel 20 may be a film made of or including aluminum (Al). The adhesive layer 15 may provide a certain adhesive force in order to laminate the cover panel 20 to the base film 10.

The PCB 30 is attached to the cover panel 20 with a PCB adhesive 25 therebetween, and is electrically connected to the display panel 50 by a flexible printed circuit board (FPCB) 35. The PCB 30 may be of a rigid type, and a plurality of driving elements (integrated circuits, ICs) and memory for driving the display panel 50 may be mounted on the PCB 30.

The flexible printed circuit board 35 has flexibility, and the flexible printed circuit board 35 may be bent when the PCB 30 is placed below the display panel 50. The flexible printed circuit board 35 may be provided in a plurality along the longitudinal direction (x direction) of the PCB 30 and may be connected to the display panel 50 at multiple locations.

On the cover panel 20, a cut line region 40 may be formed around the area where the PCB 30 is attached, to have an area larger than an area of the PCB 30 in a plan view.

As shown in FIGS. 4 and 5, the boundary line of the cut line region 40 may be formed as a partially cut dotted line. The boundary line of the cut line region 40 may extend along an edge of the PCB 30 in a plane of the PCB 30. This form may be manufactured by laser cutting or pressure cutting.

As shown in FIG. 4, the cut line region 40 may have an area larger than the area of the PCB 30 in a plan view. For example, the cut line region 40 may have a boundary line that is approximately 4.5 mm to 5.5 mm larger in its size in x direction or y direction than the size of the PCB 30. This structure allows the PCB 30 to be smoothly attached and detached from the cover panel 20 while the cut line region 40 remains attached to the PCB 30. The x, y, and z directions may be perpendicular to one another.

Additionally, as shown in FIG. 6, the cut line region 40 may be formed to penetrate the cover panel 20. That is, the boundary line of the cut line region 40 is formed to penetrate the cover panel 20 in the thickness direction (z direction) of the cover panel 20, and extends to the adhesive layer 15 to be formed to penetrate the adhesive layer 15.

In an embodiment, an opening (e.g., through hole) may be defined in the adhesive layer 15 within the cut line region 40 in a plan view. The adhesive layer 15 may be manufactured in a form in which a part of the adhesive layer 15 within the cut line region 40 in the plan view may be omitted, and then attached to the base film 10. The opening in the adhesive layer 15 may have a size corresponding to the cut line region 40.

In another embodiment, the adhesive layer 15 may be manufactured in a form in which a part of the adhesive layer 15 within the cut line region 40 in the plan view may not have adhesiveness and then attached to the base film 10. An area of the adhesive layer 15 where adhesiveness is removed may have a size corresponding to the cut line region 40.

Figure 7:
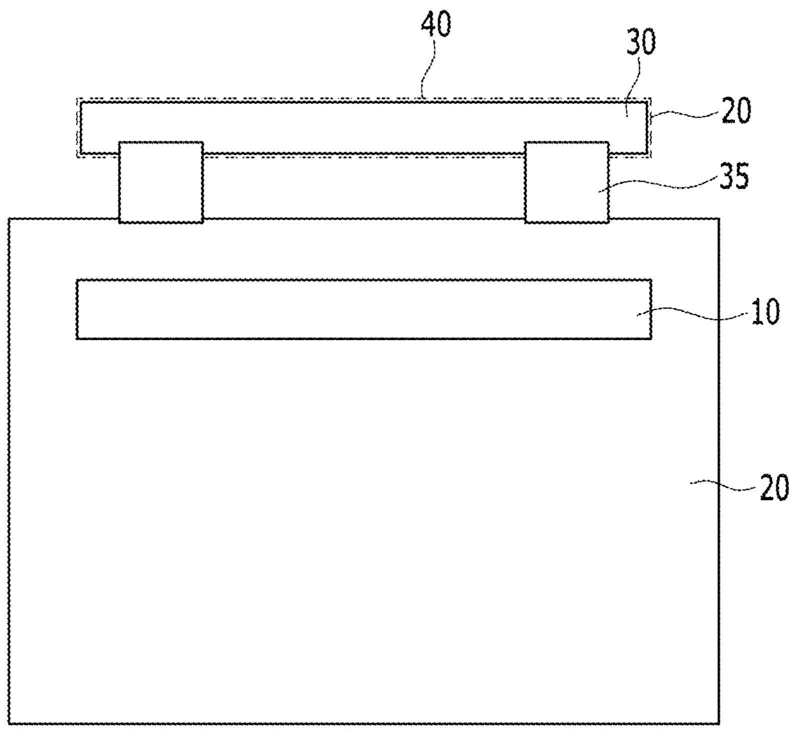
FIG. 7 is a plan view showing a state in which the PCB is detached during a rework process in a display device according to an embodiment of the present disclosure.

FIG. 7 is a plan view showing a state in which the PCB is detached during a rework process in a display device according to an embodiment of the present disclosure.

Referring to FIG. 7, when the PCB 30 is detached from the base film 10 for a rework process, the PCB 30 is detached while attached to a part of the cover panel 20 within the cut line region 40. The part of the cover panel 20 within the boundary line of the cut line region 40 is easily separated from the cover panel 20 by an appropriate force, and the part of the cover panel 20 is detached along with the PCB 30 while being adhered by the PCB adhesive 25. At this time, the boundary line of the cut line region 40 may be broken with a force smaller than the adhesive force of the PCB adhesive 25.

In an embodiment, the adhesive layer 15 may be formed in a manner that a part of the adhesive layer 15 within the cut line region 40 in the plan view is removed. In this embodiment, when separating the PCB 30 and a part of the cover panel 20 within the cut line region 40 together from the base film 10, the PCB 30 and the part of the cover panel 20 can be easily detached without any resistance due to the adhesive force of the adhesive layer 15. In another embodiment in which a part of the adhesive layer 15 within the cut line region 40 in the plan view does not have adhesiveness, the PCB 30 and the part of the cover panel 20 may be easily separated without resistance from the adhesive force of the adhesive layer 15.

The adhesive layer 15 in the form described above may be manufactured in a form where it is removed in the cut line region 40 and then attached to form on the base film 10, or it may be manufactured in a form where adhesiveness is removed in the cut line region 40 and then attached to form on the base film 10.

After the PCB 30 is detached from the cover panel 20, the PCB adhesive 25 existing between the PCB 30 and the cover panel 20 may be simply removed using the operator's hands or tweezers.

Figure 8:
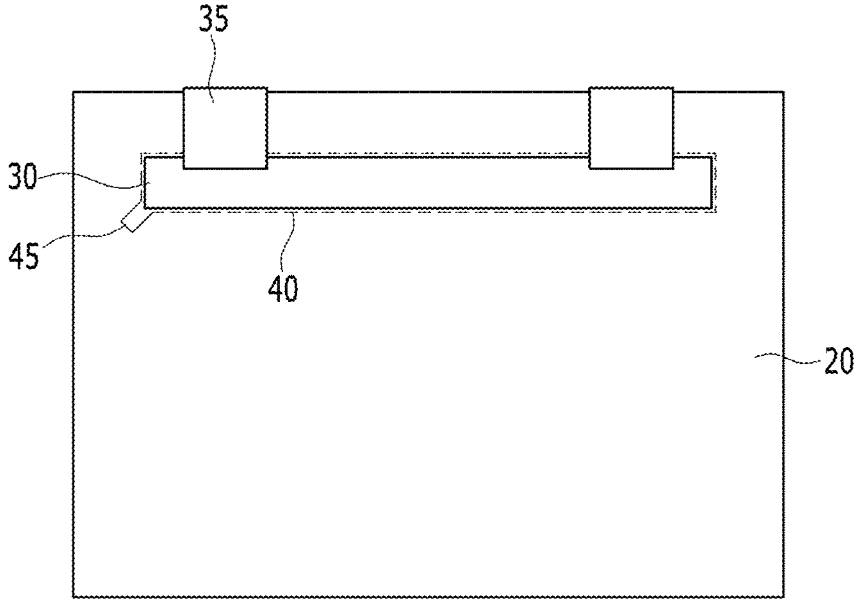
FIG. 8 is a plan view showing an embodiment in which a rework handle is provided in a display device according to an embodiment of the present disclosure.
Figure 9:
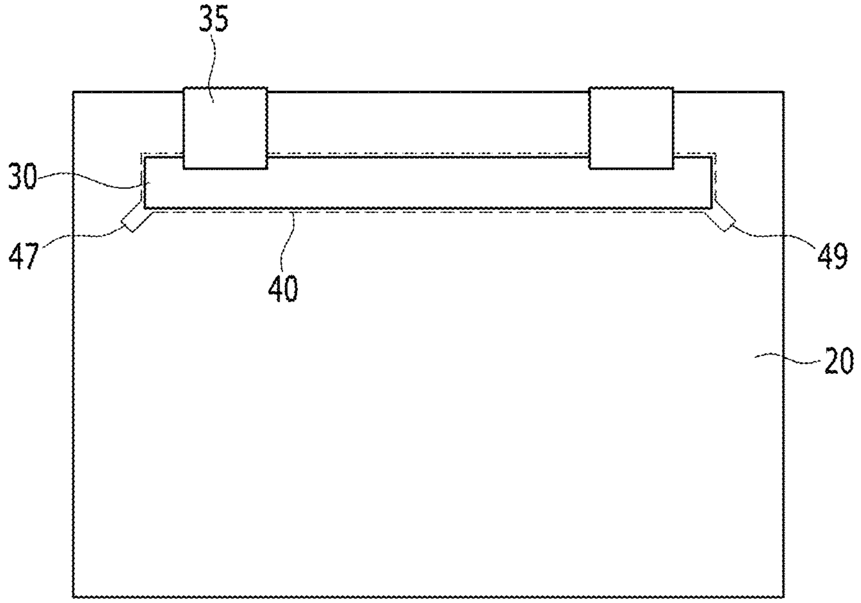
FIG. 9 is a plan view showing another embodiment in which a rework handle is provided in a display device according to an embodiment of the present disclosure.

FIG. 8 is a plan view showing an embodiment equipped with a rework handle in a display device according to an embodiment of the present disclosure, and FIG. 9 is a plan view showing another embodiment equipped with a rework handle in a display device according to an embodiment of the present disclosure.

Referring to FIG. 8, a rework handle 45 may be provided at the boundary line of the cut line region 40 and protrudes outward from the boundary line of the cut line region 40. The rework handle 45 may be formed integrally with the cover panel 20 and may be formed of the same material as the cover panel 20.

Additionally, the rework handle 45 may be formed at a corner of the cut line region 40 and may be formed to protrude toward the opposite side of the flexible printed circuit board 35. Additionally, the rework handle 45 may be formed in a continuous form with the boundary line of the cut line region 40.

Referring to FIG. 9, the rework-specific handles 47 and 49 may be formed in plurality. The rework handles 47 and 49 may be formed at the corners of the cut line region 40 to protrude toward the opposite side of the flexible printed circuit board 35, and may be formed in the cut line region 40 at both corner parts of the PCB 30.

The rework handles 45, 47, 49 shown in FIGS. 8 and 9 are in a form lifted from the surface of the cover panel 20, allowing for easy detachment of the PCB 30 from the cover panel 20 by grabbing and lifting the rework-specific handles 45, 47, 49 using the operator's hands or the like.

As such, according to an embodiment of the present disclosure, the PCB may be easily detached from the cover panel during the rework process of the display device.

Additionally, damage to the cover panel may be prevented when removing the PCB.

Additionally, the workability of the rework process may be improved and the process time may be shortened.

Additionally, the risk of operator injury during rework may be minimized.

Figure 10:
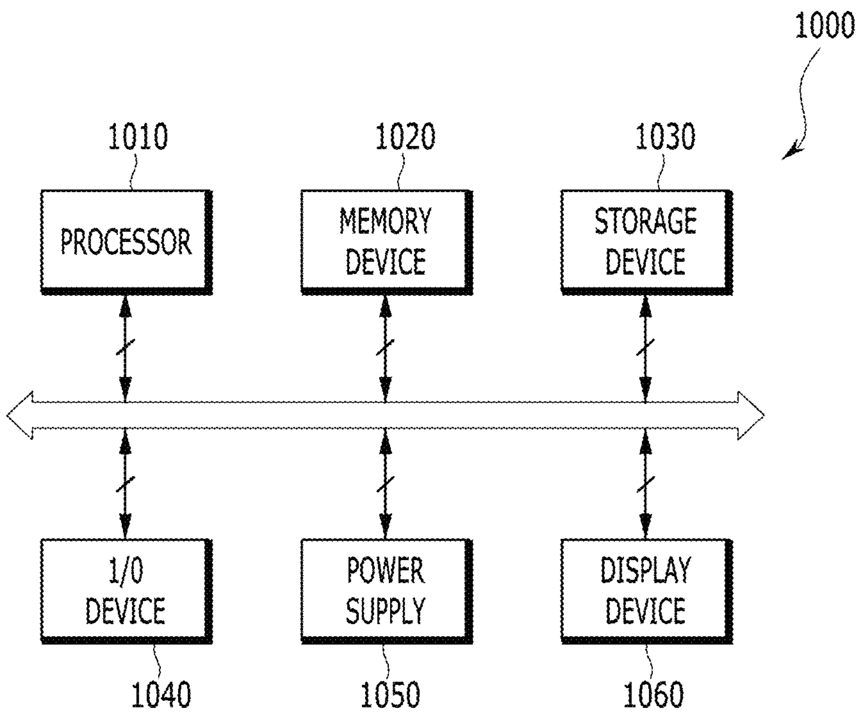
FIG. 10 is a block diagram illustrating an electronic device according to an embodiment.

FIG. 10 is a block diagram illustrating an electronic device according to an embodiment.

Referring to FIG. 10, in an embodiment, an electronic device 1000 may include a processor 1010, a memory device 1020, a storage device 1030, an input/output ("I/O") device 1040, a power supply 1050, and a display device 1060. Here, the display device 1060 may correspond to the display device of FIGS. 4 to 9. The electronic device 1000 may further include a plurality of ports for communicating with a video card, a sound card, a memory card, a universal serial bus ("USB") device, or the like. In an embodiment, the electronic device 1000 may be implemented as a television. In another embodiment, the electronic device 1000 may be implemented as a smart phone. However, embodiments are not limited thereto, in another embodiment, the electronic device 1000 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 1010 may perform various computing functions. In an embodiment, the processor 1010 may be a microprocessor, a central processing unit ("CPU"), an application processor ("AP"), or the like. The processor 1010 may be coupled to other components via an address bus, a control bus, a data bus, or the like. In an embodiment, the processor 1010 may be coupled to an extended bus such as a peripheral component interconnection ("PCI") bus.

The memory device 1020 may store data for operations of the electronic device 1000. In an embodiment, the memory device 1020 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

In an embodiment, the storage device 1030 may include a solid state drive ("SSD") device, a hard disk drive ("HDD") device, a CD-ROM device, or the like. In an embodiment, the I/O device 1040 may include an input device such as a keyboard, a keypad, a mouse device, a touchpad, a touch-screen, or the like, and an output device such as a printer, a speaker, or the like.

The power supply 1050 may provide power for operations of the electronic device 1000. The power supply 1050 may provide power to the display device 1060. The display device 1060 may be coupled to other components via the buses or other communication links. In an embodiment, the display device 1060 may be included in the I/O device 1040.

Although the embodiments of the present disclosure have been described in detail above, the scope of the present disclosure is not limited thereto, and various modifications and improvements made by those skilled in the art using the basic concepts of the present disclosure defined in the following claims are also possible.

What is claimed is:

1. A display device, comprising:

a display panel, a base film, which is attached to the display panel and protects the display panel, a cover panel attached to the base film by an adhesive layer on a side of the base film opposite to a side of the base film to which the display panel is attached, and a printed circuit board (PCB) attached to the cover panel by PCB adhesive therebetween and electrically connected to the display panel via a flexible printed circuit board, wherein a cut line region is formed around an area where the PCB is attached on the cover panel to have an area larger than the area of the PCB in a plan view.

2. The display device of claim 1, wherein:

the cover panel is formed of an aluminum (Al) film.

3. The display device of claim 1, wherein:

a boundary line of the cut line region is formed as a partially cut dotted line.

4. The display device of claim 1, wherein:

a boundary line of the cut line region extends along an edge of the PCB in a plane of the PCB.

5. The display device of claim 1, wherein:

the cut line region is formed to penetrate the cover panel in a direction in which the cover panel is attached to the base film.

6. The display device of claim 1, wherein:

the cut line region is formed as an area that is 4.5 mm to 5.5 mm larger than the area where the PCB is attached to the cover panel in the plan view.

7. The display device of claim 1, wherein:

an opening is defined in the adhesive layer in a region corresponding to the cut line region.

8. The display device of claim 7, wherein:

the opening in the adhesive layer has a size corresponding to the cut line region.

9. The display device of claim 1, wherein:

the adhesive layer is formed with that adhesiveness is removed in a region corresponding to the cut line region.

10. The display device of claim 9, wherein:

an area of the adhesive layer where adhesiveness is removed has a size corresponding to the cut line region.

11. The display device of claim 1, wherein:

the PCB adhesive is removed after the PCB is detached from the cover panel.

12. The display device of claim 1, wherein:

the cut line region includes at least one rework handle that protrudes outward from a boundary line of the cut line region and is provided to detach the PCB from the cover panel.

13. The display device of claim 12, wherein:

the rework handle is formed at a corner of the cut line region.

14. The display device of claim 12, wherein:

the rework handle is formed of a same material as the cover panel.

15. An electronic device comprising:

a display device; and a power supply configured to provide power to the display device, wherein the display device comprises:

a display panel, a base film, which is attached to the display panel and protects the display panel, a cover panel attached to the base film by an adhesive layer on a side of the base film opposite to a side of the base film to which the display panel is attached, and a printed circuit board (PCB) attached to the cover panel by PCB adhesive therebetween and electrically connected to the display panel via a flexible printed circuit board, wherein a cut line region is formed around an area where the PCB is attached on the cover panel to have an area larger than the area of the PCB in a plan view.

* * * * *